US012626760B2

(12) United States Patent
Chen et al.

(10) Patent No.: US 12,626,760 B2
(45) Date of Patent: May 12, 2026

(54) MEMORY CIRCUITRY AND METHOD USED IN FORMING MEMORY CIRCUITRY THAT HAS AN INSULATOR TIER DIRECTLY BELOW A LOWEST UPPER FIRST TIER AND DIRECTLY ABOVE AN UPPERMOST LOWER FIRST TIER

(71) Applicant: Micron Technology, Inc., Boise, ID (US)

(72) Inventors: Jiewei Chen, Meridian, ID (US); Shuangqiang Luo, Boise, ID (US); Lifang Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 775 days.

(21) Appl. No.: 17/882,053

(22) Filed: Aug. 5, 2022

(65) Prior Publication Data

US 2024/0046989 A1 Feb. 8, 2024

(51) Int. Cl.
*H10B 43/10* (2023.01)
*G11C 16/04* (2006.01)
(Continued)

(52) U.S. Cl.
CPC ......... *G11C 16/0483* (2013.01); *H10B 43/10* (2023.02); *H10B 43/27* (2023.02); *H10B 43/35* (2023.02)

(58) Field of Classification Search
CPC . H01L 27/1027; H01L 27/1028; H10B 53/00; H10B 53/10; H10B 53/20;
(Continued)

(56) References Cited

U.S. PATENT DOCUMENTS

2001/0015430 A1* 8/2001 Hartner .................. H10D 1/696
257/E21.664
2008/0073635 A1* 3/2008 Kiyotoshi ............ H10D 64/685
257/E21.409
(Continued)

*Primary Examiner* — William B Partridge
*Assistant Examiner* — Gustavo G Ramallo
(74) *Attorney, Agent, or Firm* — Wells St. John P.S.

(57) ABSTRACT

A method used in forming a memory array comprising strings of memory cells comprises forming a lower stack comprising vertically-alternating different-composition lower first tiers and lower second tiers. The lower stack comprises lower channel-material strings extending through the lower first tiers and the lower second tiers. An upper stack is formed directly above the lower stack. The upper stack comprises vertically-alternating different-composition upper first tiers and upper second tiers. The upper stack comprises upper channel-material strings of select-gate transistors. Individual of the upper channel-material strings are directly electrically coupled to individual of the lower channel-material strings. The upper and lower first tiers are conductive at least in a finished-circuitry construction. The upper and lower second tiers are insulative and comprise insulative material. An insulator tier comprising insulator material is directly below a lowest of the upper first tiers and directly above an uppermost of the lower first tiers. The insulator material is of different composition from that of the insulative material of the upper second tiers and of different composition from that of the insulative material of the lower second tiers. Other embodiments, including structure, are disclosed.

32 Claims, 11 Drawing Sheets

(51) Int. Cl.
    *H10B 43/27*         (2023.01)
    *H10B 43/35*         (2023.01)

(58) Field of Classification Search
    CPC ........ H10B 53/30; H10B 53/40; H10B 53/50;
                H10B 41/10; H10B 41/20; H10B 41/23;
                H10B 41/27; H10B 41/30; H10B 41/35;
                H10B 41/40–44; H10B 41/46–50; H10B
                41/60; H10B 43/10; H10B 43/20; H10B
                43/23; H10B 43/27; H10B 43/30; H10B
                43/35; H10B 43/40; H10B 51/00; H10B
                51/10; H10B 51/20; H10B 51/30; H10B
                51/40; H10B 51/50; H10B 41/00–70;
                H10B 43/00–50
    See application file for complete search history.

(56)              References Cited

U.S. PATENT DOCUMENTS

| | | | |
|---|---|---|---|
| 2009/0224309 A1* | 9/2009 | Kidoh | H10B 43/50 |
| | | | 257/326 |
| 2010/0128531 A1* | 5/2010 | Lee | G11C 16/0466 |
| | | | 365/185.05 |
| 2015/0221376 A1* | 8/2015 | Choi | G11C 16/0483 |
| | | | 365/185.11 |
| 2020/0144308 A1* | 5/2020 | Yakubo | H10D 86/451 |
| 2021/0082806 A1* | 3/2021 | Hopkins | H10B 41/10 |

* cited by examiner

MEMORY CIRCUITRY AND METHOD USED IN FORMING MEMORY CIRCUITRY THAT HAS AN INSULATOR TIER DIRECTLY BELOW A LOWEST UPPER FIRST TIER AND DIRECTLY ABOVE AN UPPERMOST LOWER FIRST TIER

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
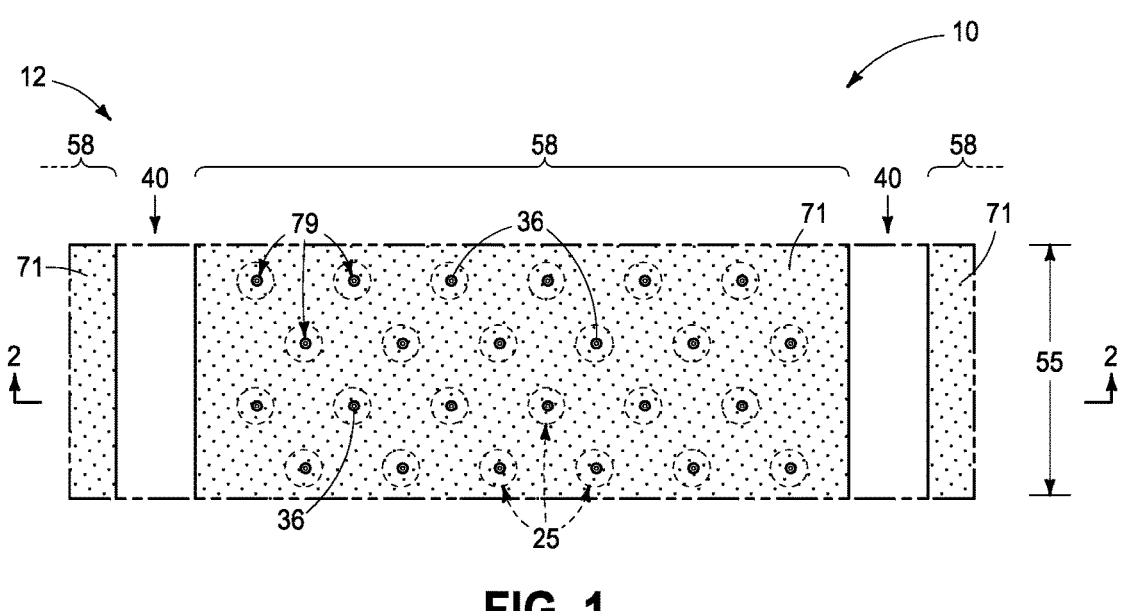
FIGS. 1-4 are diagrammatic cross-sectional views of portions of a construction that will comprise an array of elevationally-extending strings of memory cells in accordance with an embodiment of the invention.
Figure 2:
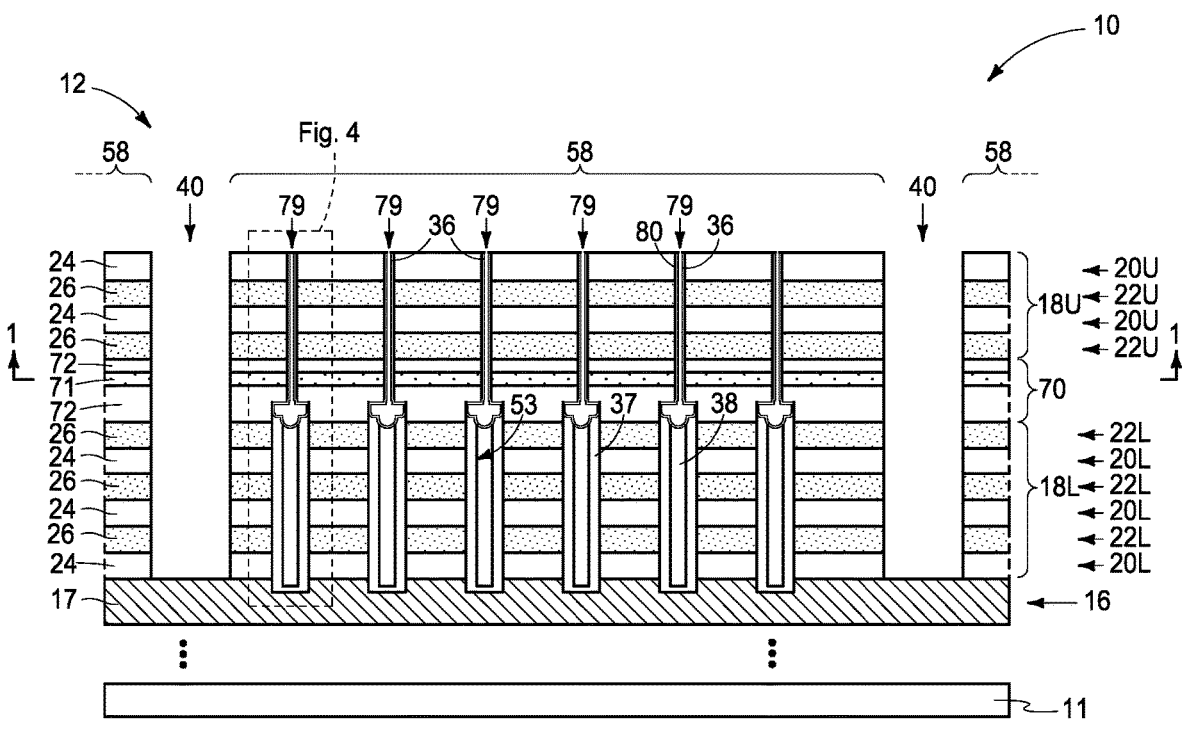
Figure 3:
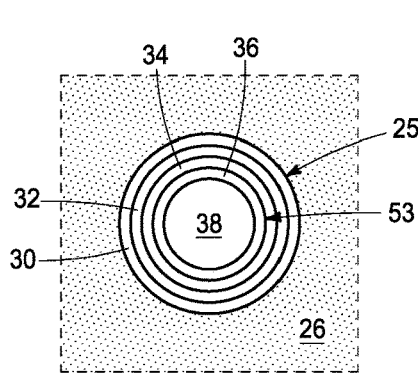
Figure 4:
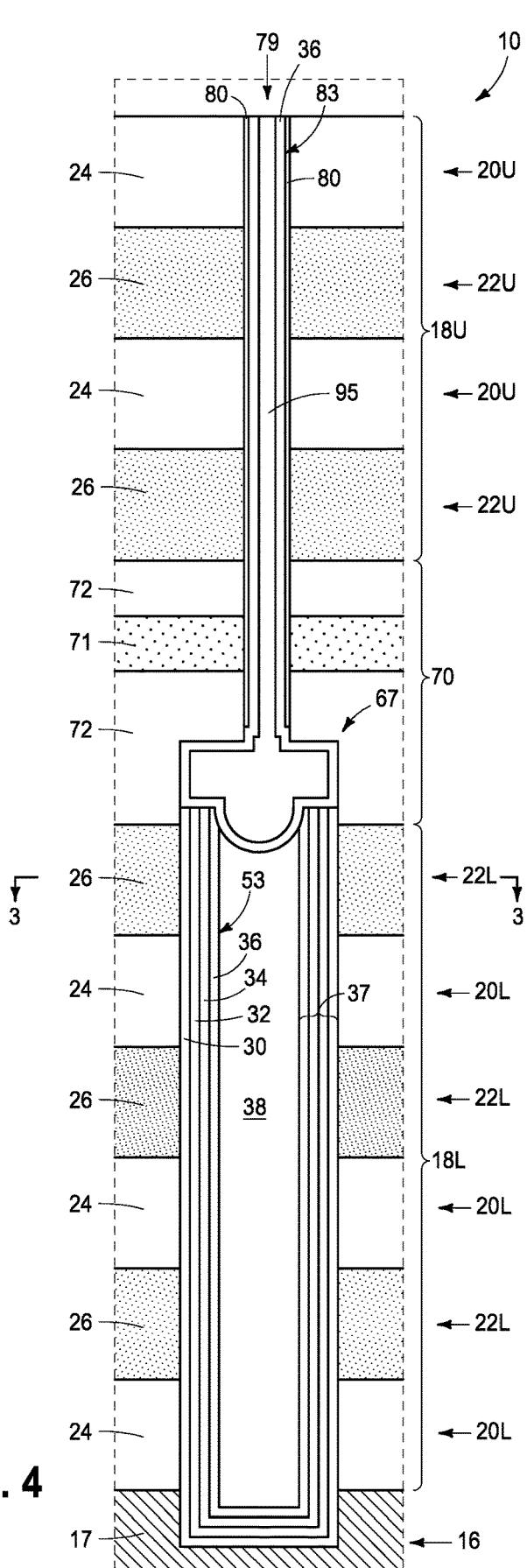

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry comprising a memory array comprising strings of memory cells (e.g., NAND architecture) independent of method of manufacture. First example method embodiments are described with reference to FIGS. 1-17.

FIGS. 1-4 show an example construction 10 having an array 12 in which elevationally-extending strings of transistors and/or memory cells will be formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-6—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., $WSi_x$ under conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A lower stack 18L comprising vertically-alternating lower insulative tiers 20L and lower conductive tiers 22L is directly above conductor tier 16. In some embodiments, lower conductive tiers 22L may be referred to as lower first tiers 22L and lower insulative tiers 20L may be referred to as lower second tiers 20L. Lower first tiers 22L may be conductive and lower second tiers 20L may be insulative, yet need not be so at this point of processing in conjunction with the hereby initially-described example method embodiment which is "gate-last" or "replacement-gate". Example thickness for each of tiers 20L and 22L is 20 to 60 nanometers. The example uppermost tier 20L may be thicker/thickest compared to one or more other tiers 20L and/or 22L. Example lower first tiers 22L comprise material 26 (e.g., silicon nitride) and example lower second tiers 20L comprise material 24 (e.g., silicon dioxide). Only a small number of tiers 20L and 22L is shown in FIGS. 1-4, with more likely lower stack 18L comprising dozens, a hundred or more, etc. of tiers 20L and 22L. Other circuitry that may or may not be part of peripheral and/or control circuitry may be between conductor tier 16 and lower stack 18L. For example, multiple vertically-alternating tiers of conductive material and insulative material of such circuitry may be below a lowest of the lower conductive tiers 22L and/or above an uppermost of the lower conductive tiers 22L. For example, one or more select gate tiers (not shown) may be between conductor tier 16 and the lowest lower conductive tier 22L. Alternately or additionally, at least one of the depicted lowest lower conductive tiers 22L may be a select gate tier.

Channel openings 25 have been formed (e.g., by etching) through lower insulative tiers 20L and lower conductive tiers 22L to conductor tier 16. Channel openings 25 may taper radially-inward and/or radially-outward (not shown) moving deeper in lower stack 18L. In some embodiments, channel openings 25 may go into conductor material 17 of conductor tier 16 as shown or may stop there-atop (not shown). Alternately, as an example, channel openings 25 may stop atop or within the lowest lower insulative tier 20L. A reason for extending channel openings 25 at least to conductor material 17 of conductor tier 16 is to assure direct electrical coupling of channel material to conductor tier 16 without using alternative processing and structure to do so when such a connection is desired and/or to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of six openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a first direction 55. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

The figures show one embodiment wherein charge-blocking material 30, storage material 32, and charge-passage material 34 have been formed in individual channel openings 25 elevationally along lower insulative tiers 20L and lower conductive tiers 22L. Transistor materials 30, 32, and 34 (e.g., memory-cell materials) may be formed by, for example, deposition of respective thin layers thereof over lower stack 18L and within individual channel openings 25 followed by planarizing such back at least to a top surface of lower stack 18L as shown.

Channel material 36 has also been formed in channel openings 25 elevationally along lower insulative tiers 20L and lower conductive tiers 22L and comprise individual lower channel-material strings 53 in one embodiment having memory-cell materials (e.g., 30, 32, and 34) there-along and with material 24 in lower insulative tiers 20L being horizontally-between immediately-adjacent lower channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (lower channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Materials 30, 32, 34, and 36 are shown as having planar tops and which are coplanar, although alternate constructions may be used, for example whereby channel material 36 has its top higher than each of materials 30, 32, and 34.

An upper stack 18U has been formed directly above lower stack 18L. Upper stack 18U comprises vertically-alternating different-composition upper first tiers 22U and upper second tiers 20U. Upper first tiers 22U and lower first tiers 22L are conductive at least in a finished-circuitry construction. Upper second tiers 20U and lower second tiers 20L are insulative and comprise insulative material (e.g., material 24). More upper first tiers 22U and more upper second tiers 20U would likely be in construction 10 than are shown. In one embodiment, the insulative material of upper second tiers 20U and the insulative material of lower second tiers 22L are of the same composition relative one another. Upper stack 18U comprises upper channel-material strings 83 (e.g., comprising channel material 36). Upper channel-material strings 83 will comprise part of select-gate transistors 84 (e.g., select gate drains) comprising gates 82 (neither of which is shown yet due to the example gate-last processing). Example upper channel-material strings 83 are in upper channel openings 79 that have previously been lined with a gate insulator 80 (e.g., silicon dioxide). An insulator 95 (e.g., silicon dioxide) may fill remaining volume of upper channel openings 79. A conductive plug (not shown) may be atop or radially inward of and, regardless, directly against upper channel-material string 83 at its top for better electrical connection to other components (not shown) of integrated circuitry above the depicted construction and which are not material to the inventions disclosed herein. Individual upper channel-material strings 83 are directly electrically coupled to individual lower channel-material strings 53, for example through example individual structures 67.

An insulator tier 70 comprising insulator material 71 is directly below a lowest of upper first tiers 22U and directly above an uppermost of lower first tiers 22L. Insulator material 71 is of different composition from that of the insulative material (e.g., 24) of upper second tiers 20U and of different composition from that of the insulative material (e.g., 24) of lower second tiers 20L. In one embodiment, insulator material 71 comprises at least one (only one or more than one) of carbon-doped silicon nitride, hafnium oxide, carbon-doped hafnium oxide, boron, carbon-doped boron, boron oxide, carbon-doped boron oxide, zirconium oxide, carbon-doped zirconium oxide, aluminum oxide, and carbon-doped aluminum oxide. Example concentration of the carbon doping is from 0.1 to 30 percent atomic, with 1 to 5 percent being preferred.

Figure 5:
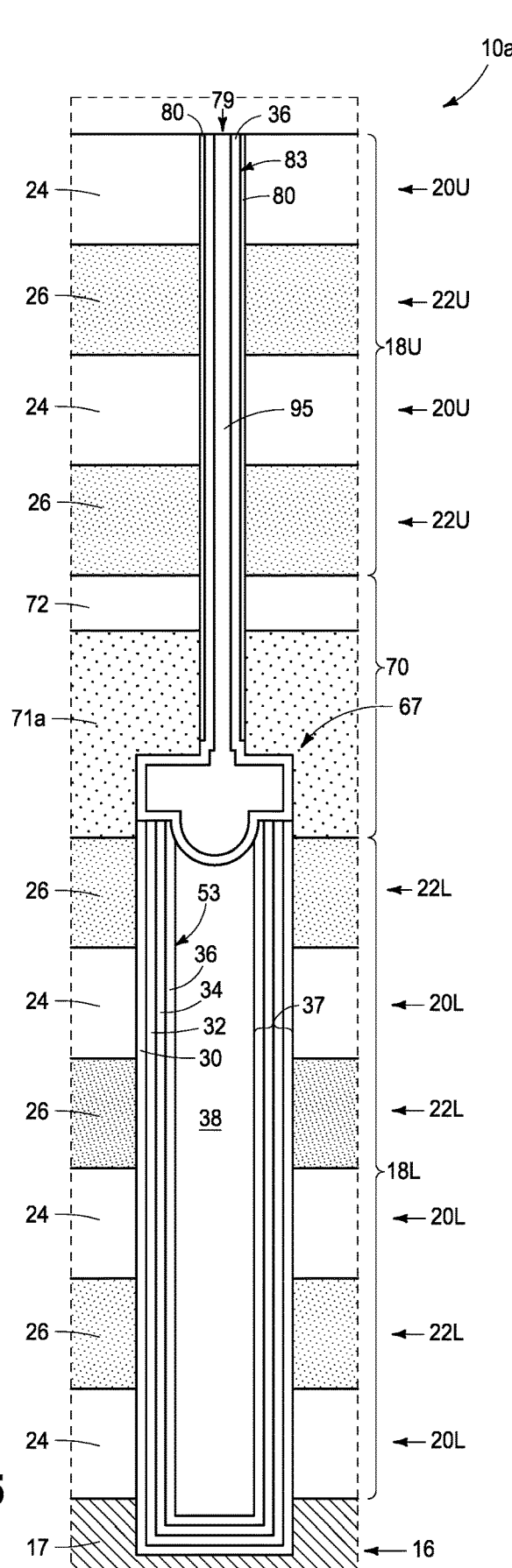
FIGS. 5-17 are diagrammatic sequential sectional and/or enlarged views of the construction of FIGS. 1-4, or portions thereof or alternate and/or additional embodiments, in process in accordance with some embodiments of the invention.
Figure 6:
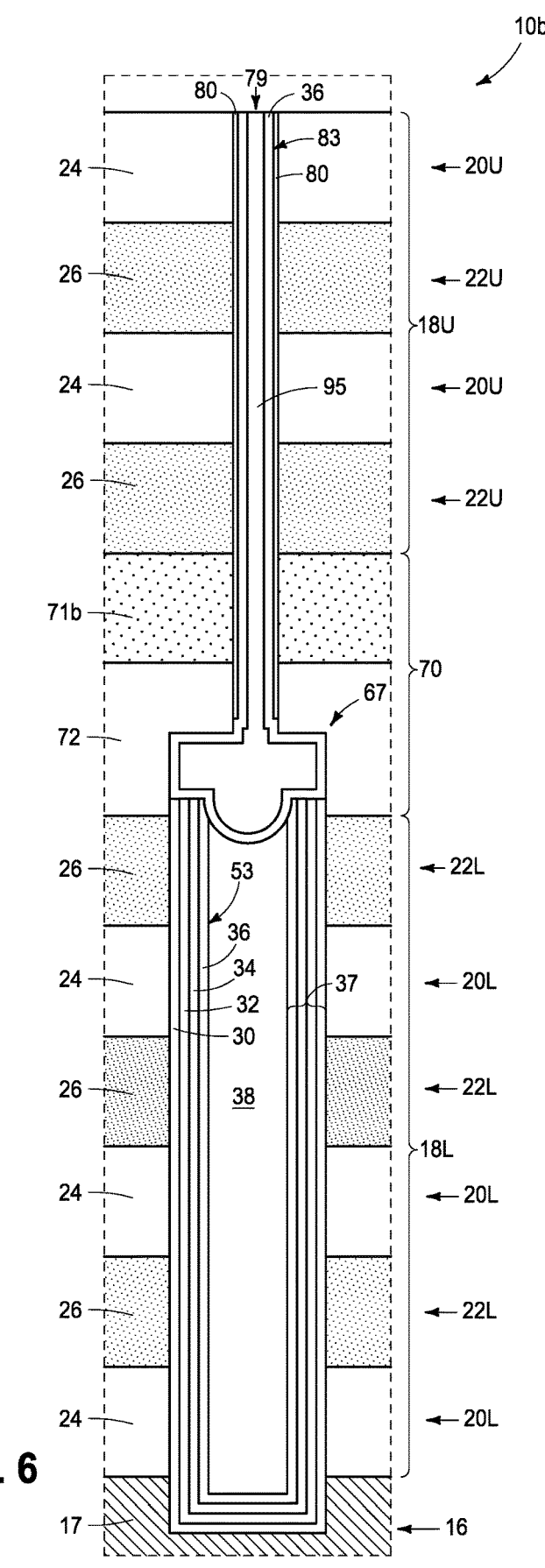
Figure 7:
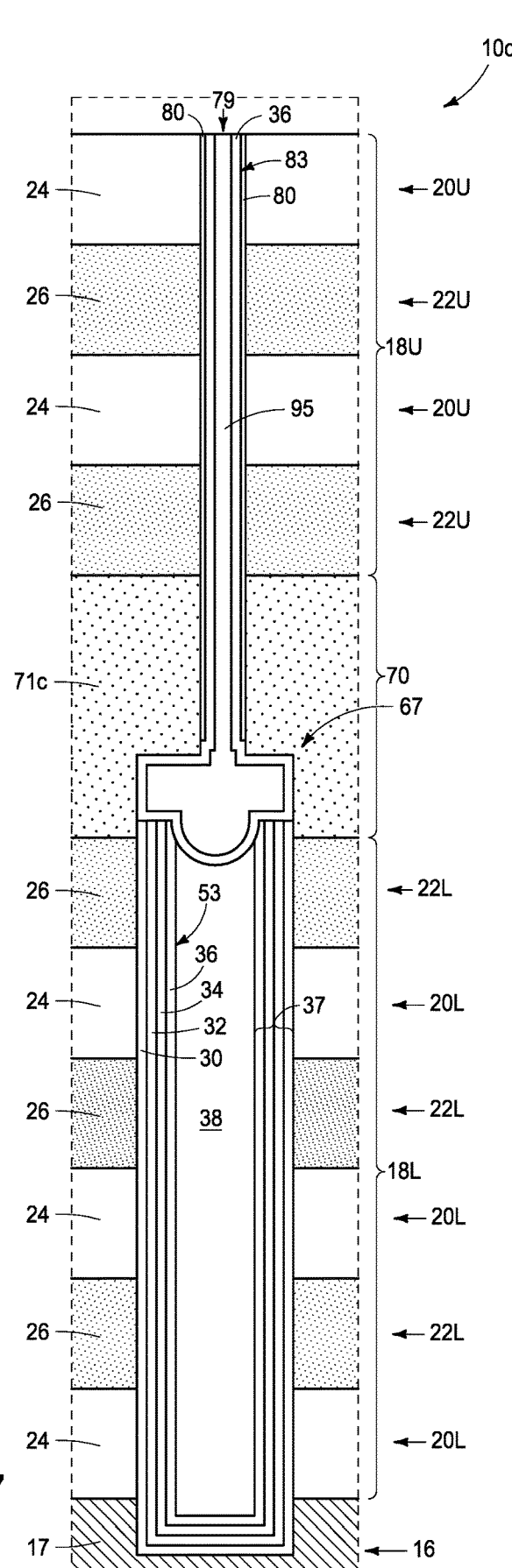

In one embodiment, insulator tier 70 comprises insulating material 72 (e.g., silicon dioxide) of different composition from that of insulator material 71 and that is at least one of directly above and directly below insulator material 71. FIGS. 1-4 show an embodiment where insulating material 72 is both directly above and directly below insulator material 71. FIG. 5 shows an alternate example construction 10a where insulating material 72 is only directly above insulator material 71a and FIG. 6 shows an alternate example construction 10b where insulating material 72 is only directly below insulator material 71b. Like numerals from the above-described embodiments have been used where appropriate, with some construction differences being indicated with the suffix "a" and "b", respectively, or with different numerals. FIG. 7 shows an alternate example construction 10c having insulator material 71c and which is devoid of insulating material 72. Like numerals from the above-described embodiments have been used where appropriate, with some construction differences being indicated with the suffix "c" or with different numerals. Regardless, in one embodiment insulator material 71/71a/71b/71c is homogenous.

Horizontally-elongated trenches 40 have been formed (e.g., by anisotropic etching) between immediately-laterally-adjacent memory-block regions 58. Trenches 40 will typically be wider than channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Trenches 40 may taper laterally inward and/or outward in vertical cross-section (not shown).

Figures 8, 9:
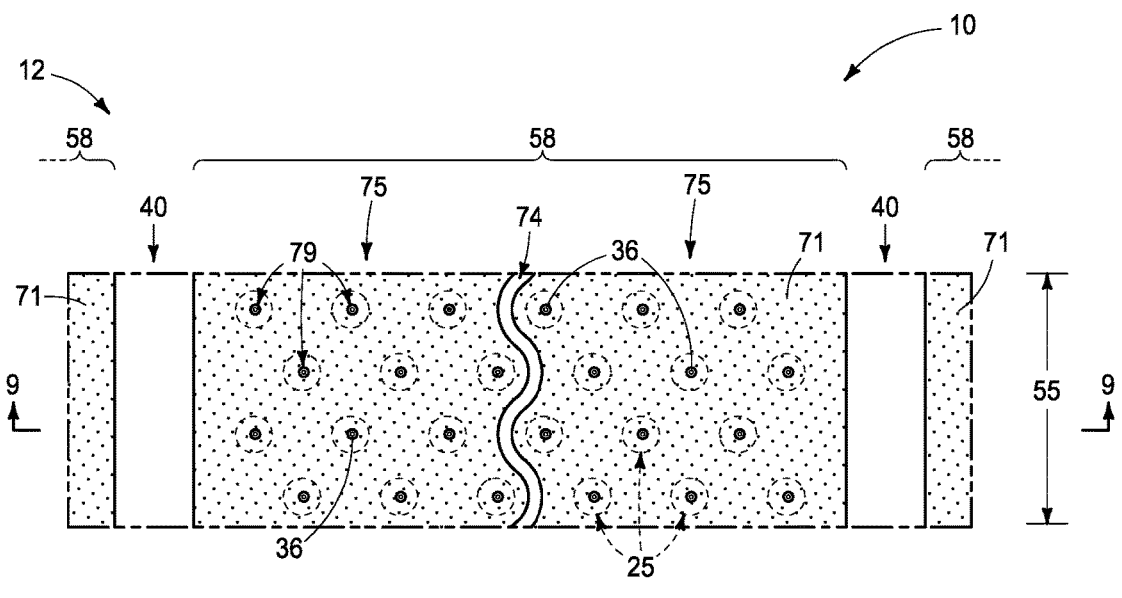
Figures 10, 11:
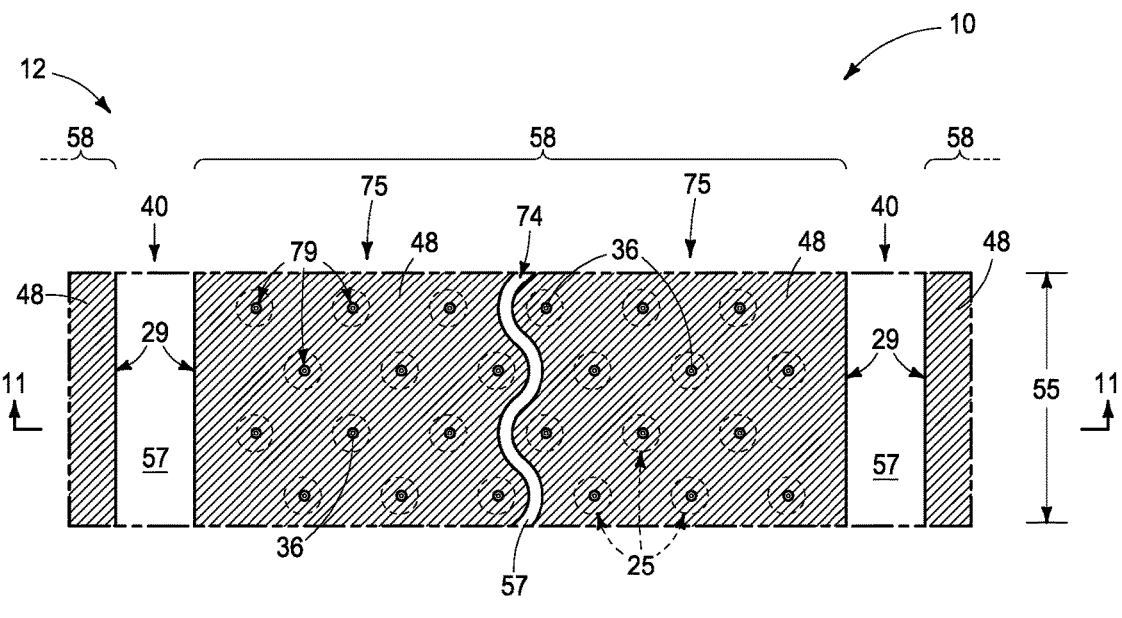
Figures 12, 13, 14:
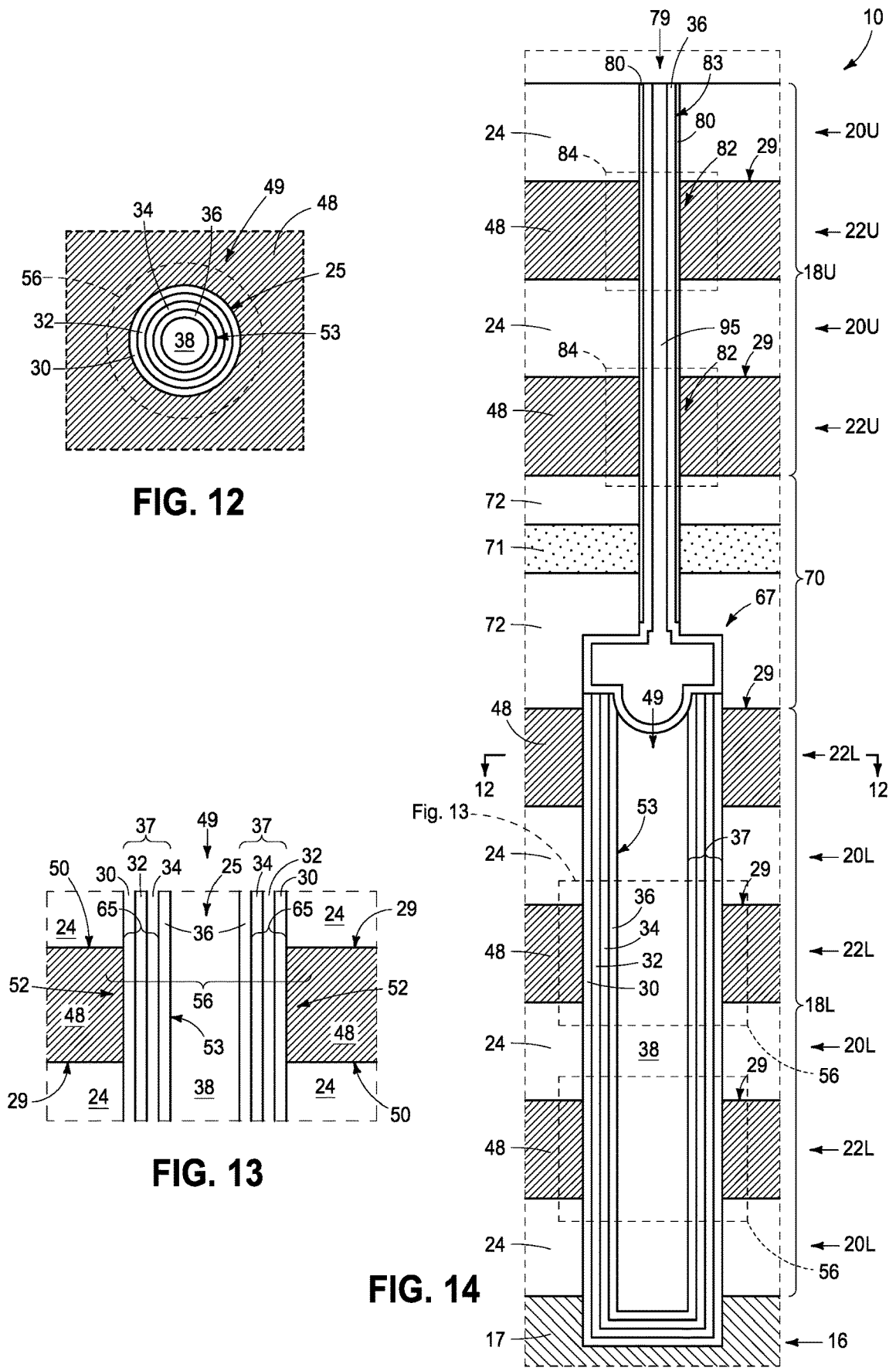

Referring to FIGS. 8 and 9, and in one embodiment, horizontally-elongated trenches 74 have been etched through upper first tiers 22U and upper second tiers 20U to form sub-blocks 75. In one such embodiment, insulator material 71 of insulator tier 70 has been used as an etch-stop to form a bottom 76 of individual horizontally-elongated trenches 74 to be atop or within insulator material 71 of insulator tier 70 (within being shown). Trenches 40 and 74 may be formed in either order relative the other.

Referring to FIGS. 10-14, material 26 (not shown) of first tiers 22* (an * being used as a suffix to be inclusive of all such same-numerically-designated structures that may or may not have other suffixes) has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22* in the example embodiment is sacrificial and has been replaced with conducting material 48, and which has thereafter been removed from trenches 40, thus forming individual conductive lines 29 (e.g., wordlines in stack 18*) and elevationally-extending strings 49 of individual transistors and/or memory cells 56 in stack 18*. Select-gate transistors 84 have also been formed and comprise gates 82, and which may be circuit-parallel one another within, for example, a sub-block to function as a single select gate for individual lower channel-material strings 53. In one embodiment and as shown, select-gate transistors 84 are devoid of non-volatile charge-storage regions (e.g., no material 32).

A thin insulative liner (e.g., $Al_2O_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22\* is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22\* from shorting relative one another in a finished circuitry construction. Example insulative materials are one or more of $SiO_2$, $Si_3N_4$, and $Al_2O_3$. Intervening material 57 may include through array vias (not shown).

Figure 15:
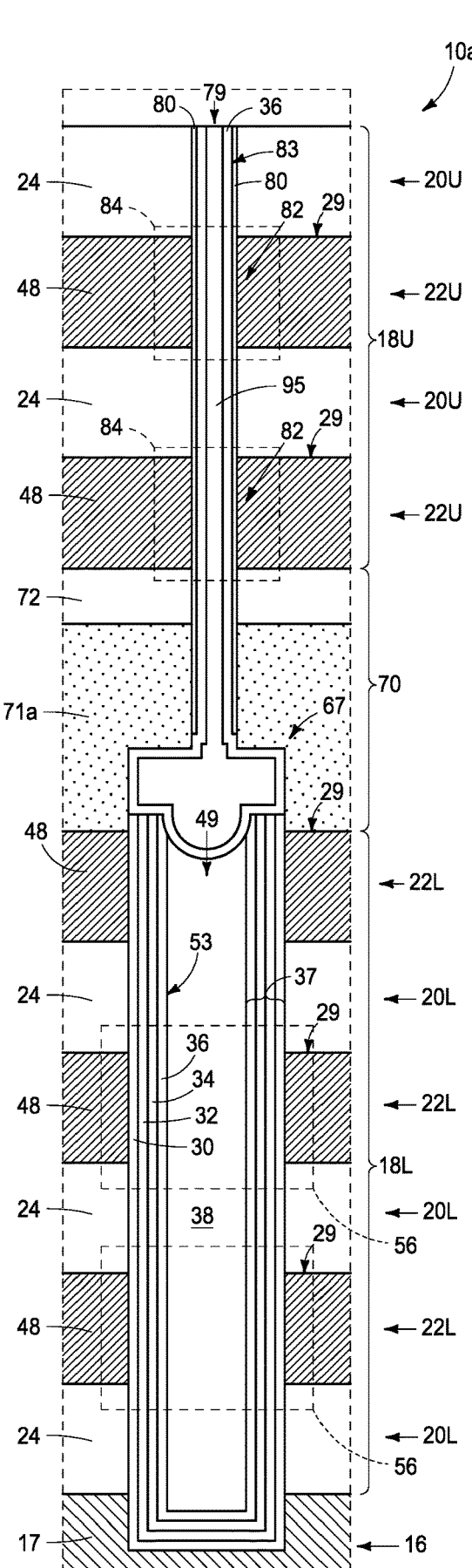
Figure 16:
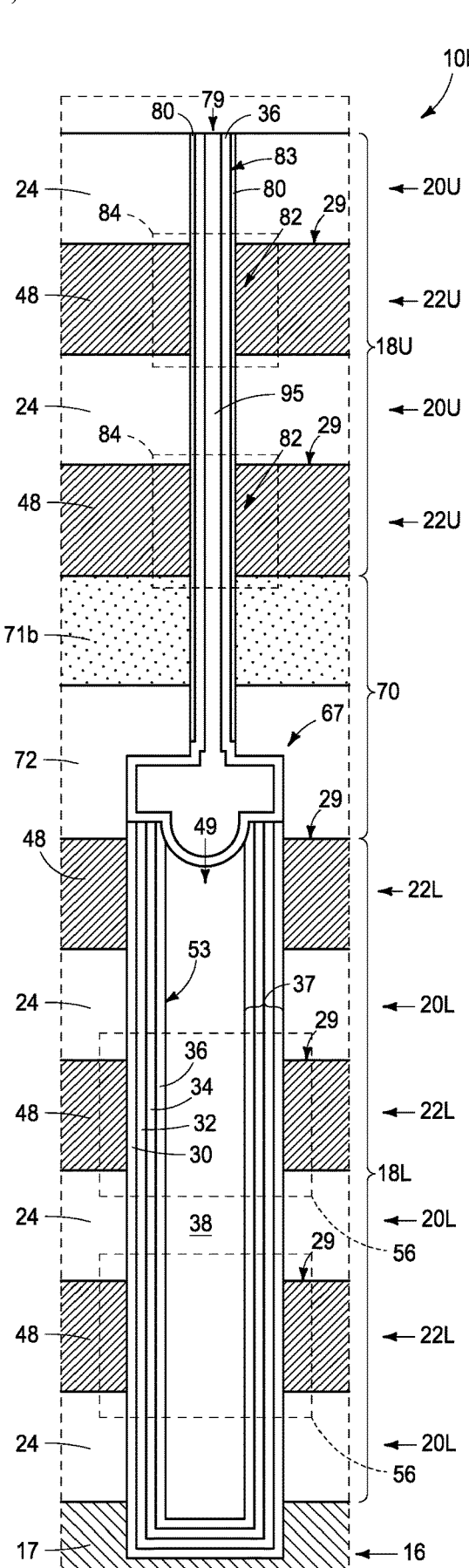
Figure 17:
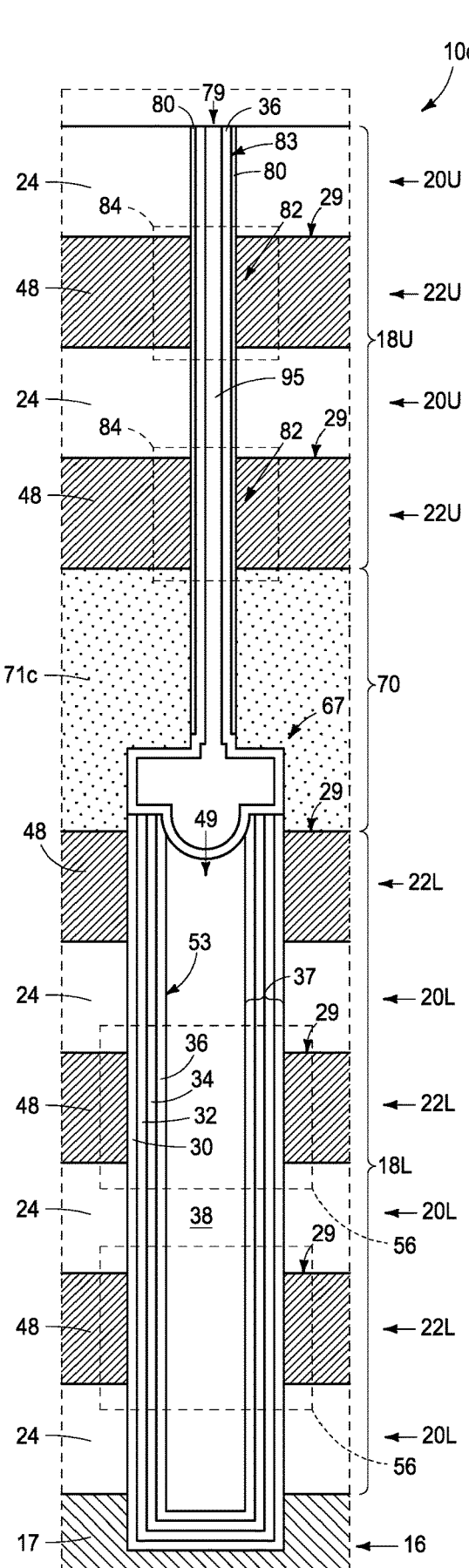

FIGS. 15, 16, and 17 show example alternate constructions 10a, 10b, and 10c, respectively. In one embodiment and as shown in construction 10c, insulator material 71c is directly against conducting material 48 of lowest upper first tier 22U and is directly against conducting material 48 of uppermost lower first tier 22L.

Any other attribute(s) or aspect(s) as shown and/or described herein with respect to other embodiments may be used in the embodiments shown and described with reference to the above embodiments.

In one embodiment, a method used in forming a memory array (e.g., 12) comprising strings (e.g., 49) of memory cells (e.g., 56) comprises forming a lower stack (e.g., 18L) comprising vertically-alternating different-composition lower first tiers (e.g., 22L) and lower second tiers (e.g., 20L). The lower stack comprises lower channel-material strings (e.g., 53) extending through the lower first tiers and the lower second tiers. An upper stack (e.g., 18U) is formed directly above the lower stack. The upper stack comprises vertically-alternating different-composition upper first tiers (e.g., 22U) and upper second tiers (e.g., 20U). The upper stack comprises upper channel-material strings (e.g., 83) of select-gate transistors (e.g., 84). Individual of the upper channel-material strings are directly electrically coupled to individual of the lower channel-material strings. The upper and lower first tiers are conductive at least in a finished-circuitry construction. The upper and lower second tiers are insulative. An insulator tier (e.g., 70) comprising insulator material (e.g., 71, 71a, 71b, 71c) is directly below a lowest of the upper first tiers and directly above an uppermost of the lower first tiers. The insulator material comprises at least one of carbon-doped silicon nitride, hafnium oxide, carbon-doped hafnium oxide, boron, carbon-doped boron, boron oxide, carbon-doped boron oxide, zirconium oxide, carbon-doped zirconium oxide, aluminum oxide, and carbon-doped aluminum oxide. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a lower stack (e.g., 18L) comprising vertically-alternating lower insulative tiers (e.g., 20L) and lower conductive tiers (e.g., 22L). The strings of memory cells comprise lower channel-material strings (e.g., 53) that extend through the lower insulative tiers and the lower conductive tiers. An upper stack (e.g., 18U) comprising vertically-alternating upper insulative tiers (e.g., 20U) and upper conductive tiers (e.g., 22U) is directly above the lower stack. The upper stack comprises upper channel-material strings (e.g., 83) of select-gate transistors (e.g., 84) that are individually above and directly electrically coupled to individual of the lower channel-material strings. The upper and lower insulative tiers comprise insulative material (e.g., 24, and not necessarily the same). An insulator tier (e.g., 70) comprising insulator material (e.g., 71, 71a, 71b, 71c) is directly below a lowest of the upper conductive tiers and directly above an uppermost of the lower conductive tiers. The insulator material is of different composition from that of the insulative material of the upper insulative tiers and of different composition from that of the insulative material of the lower insulative tiers. Any other attribute(s) or aspect(s) as shown and/or described herein with respect to other embodiments may be used.

In one embodiment, a memory array (e.g., 12) comprising strings (e.g., 49) of memory cells (e.g., 56) comprises a lower stack (e.g., 18L) comprising vertically-alternating lower insulative tiers (e.g., 20L) and lower conductive tiers (e.g., 22L). The strings of memory cells comprise lower channel-material strings (e.g., 53) that extend through the lower insulative tiers and the lower conductive tiers. An upper stack (e.g., 18U) comprising vertically-alternating upper insulative tiers (e.g., 20U) and upper conductive tiers (e.g., 22U) is directly above the lower stack. The upper stack comprises upper channel-material strings (e.g., 83) of select-gate transistors (e.g., 84) that are individually above and directly electrically coupled to individual of the lower channel-material strings. An insulator tier (e.g., 70) comprising insulator material (e.g., 71, 71*a*, 71*b*, 71*c*) is directly below a lowest of the upper conductive tiers and directly above an uppermost of the lower conductive tiers. The insulator material comprising at least one of carbon-doped silicon nitride, hafnium oxide, carbon-doped hafnium oxide, boron, carbon-doped boron, boron oxide, carbon-doped boron oxide, zirconium oxide, carbon-doped zirconium oxide, aluminum oxide, and carbon-doped aluminum oxide. Any other attribute(s) or aspect(s) as shown and/or described herein with respect to other embodiments may be used.

Provision of an insulator tier 70 comprising insulator material 71 as described may reduce or eliminate risk of trenches 74 being etched to and/or through integrated circuitry components there-below.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a lower stack comprising vertically-alternating different-composition lower first tiers and lower second tiers. The lower stack comprises lower channel-material strings extending through the lower first tiers and the lower second tiers. An upper stack is formed directly above the lower stack. The upper stack comprises vertically-alternating different-composition upper first tiers and upper second tiers. The upper stack comprises upper channel-material strings of select-gate transistors. Individual of the upper channel-material strings are directly electrically coupled to individual of the lower channel-material strings. The upper and lower first tiers are conductive at least in a finished-circuitry construction. The upper and lower second tiers are insulative and comprise insulative material. An insulator tier comprising insulator material is directly below a lowest of the upper first tiers and directly above an uppermost of the lower first tiers. The insulator material is of different composition from that of the insulative material of the upper second tiers and of different composition from that of the insulative material of the lower second tiers.

In some embodiments, a method used in forming a memory array comprising strings of memory cells comprises forming a lower stack comprising vertically-alternating different-composition lower first tiers and lower second tiers. The lower stack comprises lower channel-material strings extending through the lower first tiers and the lower second tiers. An upper stack is formed directly above the lower stack. The upper stack comprises vertically-alternating different-composition upper first tiers and upper second tiers. The upper stack comprises upper channel-material strings of select-gate transistors. Individual of the upper channel-material strings are directly electrically coupled to individual of the lower channel-material strings. The upper and lower first tiers are conductive at least in a finished-circuitry construction. The upper and lower second tiers are insulative. An insulator tier comprising insulator material is directly below a lowest of the upper first tiers and directly above an uppermost of the lower first tiers. The insulator material comprises at least one of carbon-doped silicon nitride, hafnium oxide, carbon-doped hafnium oxide, boron, carbon-doped boron, boron oxide, carbon-doped boron oxide, zirconium oxide, carbon-doped zirconium oxide, aluminum oxide, and carbon-doped aluminum oxide.

In some embodiments, a memory array comprising strings of memory cells comprises a lower stack comprising vertically-alternating lower insulative tiers and lower conductive tiers. Strings of memory cells comprise lower channel-material strings that extend through the lower insulative tiers and the lower conductive tiers. An upper stack comprises vertically-alternating upper insulative tiers and upper conductive tiers directly above the lower stack. The upper stack comprises upper channel-material strings of select-gate transistors and that are individually above and directly electrically coupled to individual of the lower channel-material strings. The upper and lower insulative tiers comprise insulative material. An insulator tier comprising insulator material is directly below a lowest of the upper conductive tiers and directly above an uppermost of the lower conductive tiers. The insulator material is of different composition from that of the insulative material of the upper insulative tiers and of different composition from that of the insulative material of the lower insulative tiers.

In some embodiments, a memory array comprising strings of memory cells comprises a lower stack comprising vertically-alternating lower insulative tiers and lower conductive tiers. Strings of memory cells comprise lower channel-material strings that extend through the lower insulative tiers and the lower conductive tiers. An upper stack comprises vertically-alternating upper insulative tiers and upper conductive tiers directly above the lower stack. The upper stack comprises upper channel-material strings of select-gate transistors and that are individually above and directly electrically coupled to individual of the lower channel-material strings. An insulator tier comprising insulator material is directly below a lowest of the upper conductive tiers and directly above an uppermost of the lower conductive tiers. The insulator material comprises at least one of carbon-doped silicon nitride, hafnium oxide, carbon-doped hafnium oxide, boron, carbon-doped boron, boron oxide, carbon-doped boron oxide, zirconium oxide, carbon-doped zirconium oxide, aluminum oxide, and carbon-doped aluminum oxide.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:

forming a lower stack comprising vertically-alternating different-composition lower first tiers and lower second tiers, the lower stack comprising lower channel-material strings extending through the lower first tiers and the lower second tiers;

forming an upper stack directly above the lower stack, the upper stack comprising vertically-alternating different-composition upper first tiers and upper second tiers, the upper stack comprising upper channel-material strings of select-gate transistors, individual of the upper channel-material strings being directly electrically coupled to individual of the lower channel-material strings, the upper and lower first tiers being conductive at least in a finished-circuitry construction, the upper and lower second tiers being insulative and comprising insulative material; and an insulator tier comprising insulator material directly below a lowest of the upper first tiers and directly above an uppermost of the lower first tiers, the insulator material being of different composition from that of the insulative material of the upper second tiers and of different composition from that of the insulative material of the lower second tiers, the insulator tier comprising insulating material of different composition from that of the insulator material and that is both directly above and directly below the insulator material, the insulating material that is directly below the insulator material being laterally alongside both of the upper and lower channel-material strings.

2. The method of claim 1 comprising etching horizontally-elongated trenches through the upper first and second tiers to form sub-blocks and using the insulator material of the insulator tier as an etch-stop to form a bottom of individual of the horizontally-elongated trenches to be atop or within the insulator material of the insulator tier.

3. The method of claim 1 wherein the insulative material of the upper second tiers and the insulative material of the lower second tiers are of the same composition relative one another.

4. The method of claim 1 wherein the insulator material comprises at least one of carbon-doped silicon nitride, carbon-doped hafnium oxide, boron, carbon-doped boron, boron oxide, carbon-doped boron oxide, zirconium oxide, carbon-doped zirconium oxide, aluminum oxide, and carbon-doped aluminum oxide.

5. A method used in forming a memory array comprising strings of memory cells, comprising:

forming a lower stack comprising vertically-alternating different-composition lower first tiers and lower second tiers, the lower stack comprising lower channel-material strings extending through the lower first tiers and the lower second tiers;

forming an upper stack directly above the lower stack, the upper stack comprising vertically-alternating different-composition upper first tiers and upper second tiers, the upper stack comprising upper channel-material strings of select-gate transistors, individual of the upper channel-material strings being directly electrically coupled to individual of the lower channel-material strings, the upper and lower first tiers being conductive at least in a finished-circuitry construction, the upper and lower second tiers being insulative and comprising insulative material;

an insulator tier comprising insulator material directly below a lowest of the upper first tiers and directly above an uppermost of the lower first tiers, the insulator material being of different composition from that of the insulative material of the upper second tiers and of different composition from that of the insulative material of the lower second tiers;

the upper and lower first tiers comprise conducting material in the finished-circuitry construction;

the insulator material is directly against the conducting material of the lowest upper first tier; and the insulator material is directly against the conducting material of the uppermost lower first tier.

6. The method of claim 5 wherein the insulator material is homogenous.

7. A method used in forming a memory array comprising strings of memory cells, comprising:

forming a lower stack comprising vertically-alternating different-composition lower first tiers and lower second tiers, the lower stack comprising lower channel-material strings extending through the lower first tiers and the lower second tiers;

forming an upper stack directly above the lower stack, the upper stack comprising vertically-alternating different-composition upper first tiers and upper second tiers, the upper stack comprising upper channel-material strings of select-gate transistors, individual of the upper channel-material strings being directly electrically coupled to individual of the lower channel-material strings, the upper and lower first tiers being conductive at least in a finished-circuitry construction, the upper and lower second tiers being insulative; and an insulator tier comprising insulator material directly below a lowest of the upper first tiers and directly above an uppermost of the lower first tiers; the insulator material comprising at least one of carbon-doped silicon nitride, carbon-doped hafnium oxide, boron, carbon-doped boron, boron oxide, carbon-doped boron oxide, carbon-doped zirconium oxide, and carbon-doped aluminum oxide.

8. The method of claim 7 comprising only one of the at least one.

9. The method of claim 7 comprising more than one of the at least one.

10. The method of claim 7 comprising etching horizontally-elongated trenches through the upper first and second tiers to form sub-blocks and using the insulator material of the insulator tier as an etch-stop to form a bottom of individual of the horizontally-elongated trenches to be atop or within the insulator material of the insulator tier.

11. The method of claim 7 wherein the insulator tier comprises insulating material of different composition from that of the insulator material and that is at least one of directly above and directly below the insulator material.

12. A method used in forming a memory array comprising strings of memory cells, comprising:

forming a lower stack comprising vertically-alternating different-composition lower first tiers and lower second tiers, the lower stack comprising lower channel-material strings extending through the lower first tiers and the lower second tiers;

forming an upper stack directly above the lower stack, the upper stack comprising vertically-alternating different-composition upper first tiers and upper second tiers, the upper stack comprising upper channel-material strings of select-gate transistors, individual of the upper channel-material strings being directly electrically coupled to individual of the lower channel-material strings, the upper and lower first tiers being conductive at least in a finished-circuitry construction, the upper and lower second tiers being insulative; and an insulator tier comprising insulator material directly below a lowest of the upper first tiers and directly above an uppermost of the lower first tiers; the insulator material comprising at least one of carbon-doped silicon nitride, carbon-doped hafnium oxide, boron, carbon-doped boron, boron oxide, carbon-doped boron oxide, zirconium oxide, carbon-doped zirconium oxide, aluminum oxide, and carbon-doped aluminum oxide;

the upper and lower first tiers comprise conducting material in the finished-circuitry construction;

the insulator material is directly against the conducting material of the lowest upper first tier; and the insulator material is directly against the conducting material of the uppermost lower first tier.

13. The memory array of claim 12 wherein the insulator material comprises carbon-doped aluminum oxide.

14. The memory array of claim 12 wherein the insulator material comprises carbon-doped silicon nitride.

15. The memory array of claim 12 wherein the insulator material comprises carbon-doped hafnium oxide.

16. The memory array of claim 12 wherein the insulator material comprises boron.

17. The memory array of claim 12 wherein the insulator material comprises carbon-doped boron.

18. The memory array of claim 12 wherein the insulator material comprises boron oxide.

19. The memory array of claim 12 wherein the insulator material comprises carbon-doped boron oxide.

20. The memory array of claim 12 wherein the insulator material comprises carbon-doped zirconium oxide.

21. A memory array comprising strings of memory cells, comprising:

a lower stack comprising vertically-alternating lower insulative tiers and lower conductive tiers, strings of memory cells comprising lower channel-material strings that extend through the lower insulative tiers and the lower conductive tiers;

an upper stack comprising vertically-alternating upper insulative tiers and upper conductive tiers directly above the lower stack, the upper stack comprising upper channel-material strings of select-gate transistors and that are individually above and directly electrically coupled to individual of the lower channel-material strings, the upper and lower insulative tiers comprising insulative material; and an insulator tier comprising insulator material directly below a lowest of the upper conductive tiers and directly above an uppermost of the lower conductive tiers, the insulator material being of different composition from that of the insulative material of the upper insulative tiers and of different composition from that of the insulative material of the lower insulative tiers, the insulator tier comprising insulating material of different composition from that of the insulator material and that is both directly above and directly below the insulator material, the insulating material that is directly below the insulator material being laterally alongside both of the upper and lower channel-material strings.

22. A memory array comprising strings of memory cells, comprising:

a lower stack comprising vertically-alternating lower insulative tiers and lower conductive tiers, strings of memory cells comprising lower channel-material strings that extend through the lower insulative tiers and the lower conductive tiers;

an upper stack comprising vertically-alternating upper insulative tiers and upper conductive tiers directly above the lower stack, the upper stack comprising upper channel-material strings of select-gate transistors and that are individually above and directly electrically coupled to individual of the lower channel-material strings; and an insulator tier comprising insulator material directly below a lowest of the upper conductive tiers and directly above an uppermost of the lower conductive tiers; the insulator material comprising at least one of carbon-doped silicon nitride, carbon-doped hafnium oxide, boron, carbon-doped boron, boron oxide, carbon-doped boron oxide, carbon-doped zirconium oxide, and carbon-doped aluminum oxide.

23. The memory array of claim 22 comprising more than one of the at least one of carbon-doped silicon nitride, carbon-doped hafnium oxide, boron, carbon-doped boron, boron oxide, carbon-doped boron oxide, carbon-doped zirconium oxide, and carbon-doped aluminum oxide.

24. The memory array of claim 22 wherein the insulator material comprises carbon-doped silicon nitride.

25. The memory array of claim 22 wherein the insulator material comprises carbon-doped hafnium oxide.

26. The memory array of claim 22 wherein the insulator material comprises boron.

27. The memory array of claim 22 wherein the insulator material comprises carbon-doped boron.

28. The memory array of claim 22 wherein the insulator material comprises boron oxide.

29. The memory array of claim 22 wherein the insulator material comprises carbon-doped boron oxide.

30. The memory array of claim 22 wherein the insulator material comprises carbon-doped zirconium oxide.

31. A memory array comprising strings of memory cells, comprising:

a lower stack comprising vertically-alternating lower insulative tiers and lower conductive tiers, strings of memory cells comprising lower channel-material strings that extend through the lower insulative tiers and the lower conductive tiers;

an upper stack comprising vertically-alternating upper insulative tiers and upper conductive tiers directly above the lower stack, the upper stack comprising upper channel-material strings of select-gate transistors and that are individually above and directly electrically coupled to individual of the lower channel-material strings, the upper and lower insulative tiers comprising insulative material;

an insulator tier comprising insulator material directly below a lowest of the upper conductive tiers and directly above an uppermost of the lower conductive tiers, the insulator material being of different composition from that of the insulative material of the upper insulative tiers and of different composition from that of the insulative material of the lower insulative tiers;

the insulator material is directly against conducting material of the lowest upper conductive tier; and the insulator material is directly against the conducting material of the uppermost lower conductive tier.

32. The memory array of claim 31 wherein the insulator material comprises at least one of carbon-doped silicon nitride, carbon-doped hafnium oxide, boron, carbon-doped boron, boron oxide, carbon-doped boron oxide, zirconium oxide, carbon-doped zirconium oxide, aluminum oxide, and carbon-doped aluminum oxide.

* * * * *